(12) United States Patent
Rozbroj et al.

(10) Patent No.: US 11,404,372 B2
(45) Date of Patent: Aug. 2, 2022

(54) SURFACE-MOUNT THIN-FILM FUSE HAVING COMPLIANT TERMINALS

(71) Applicant: AVX Corporation, Fountain Inn, SC (US)

(72) Inventors: Dan Rozbroj, Madra (CZ); Yehuda Seidman, Mevaseret Zion (IL); Elinor O'Neill, Mevaseret Zion (IL)

(73) Assignee: KYOCERA AVX Components Corporation, Fountain Inn, SC (US)

( * ) Notice: Subject to any disclaimer, the term of this patent is extended or adjusted under 35 U.S.C. 154(b) by 7 days.

(21) Appl. No.: 16/850,160

(22) Filed: Apr. 16, 2020

(65) Prior Publication Data

US 2020/0352026 A1 Nov. 5, 2020

Related U.S. Application Data

(60) Provisional application No. 62/841,917, filed on May 2, 2019.

(51) Int. Cl.
*H01H 85/041* (2006.01)
*H01L 23/525* (2006.01)

(52) U.S. Cl.
CPC ..... *H01L 23/5256* (2013.01); *H01H 85/0411* (2013.01); *H01H 2085/0414* (2013.01)

(58) Field of Classification Search
CPC ............ H01L 23/5256; H01H 85/0411; H01H 85/143; H01H 2085/0412; H01H 2085/0414

See application file for complete search history.

(56) References Cited

U.S. PATENT DOCUMENTS

| 5,432,378 | A | * | 7/1995 | Whitney | H01H 85/046 257/529 |
| 5,699,032 | A | | 12/1997 | Ulm, Jr. et al. | |
| 5,777,540 | A | | 7/1998 | Dedert et al. | |
| 5,923,239 | A | * | 7/1999 | Krueger | H01H 69/022 337/297 |
| 6,002,322 | A | * | 12/1999 | Krueger | H01H 69/022 29/623 |
| 6,034,589 | A | * | 3/2000 | Montgomery | H01H 85/0411 29/623 |
| 6,328,427 | B1 | * | 12/2001 | Watanabe | H01R 12/62 347/58 |
| 8,525,633 | B2 | | 9/2013 | Whitney et al. | |

(Continued)

OTHER PUBLICATIONS

Accu-Guard, "Accu-Guard Series LGA/SMD Thin-Film Fuse", 2018, 37 pages.

(Continued)

*Primary Examiner* — Jacob R Crum
(74) *Attorney, Agent, or Firm* — Dority & Manning, P.A.

(57) ABSTRACT

A surface-mountable thin-film fuse component is disclosed that may include a substrate having a top surface, a first end, and a second end that is spaced apart from the first end in a longitudinal direction. The thin-film component may include a fuse layer formed over the top surface of the substrate. The fuse layer may include a thin-film fuse track. An external terminal may be disposed along the first end of the substrate and electrically connected with the thin-film fuse track. The external terminal may include a compliant layer comprising a conductive polymeric composition.

15 Claims, 5 Drawing Sheets

(56) References Cited

U.S. PATENT DOCUMENTS

| | | | |
|---|---|---|---|
| 9,847,203 B2 | 12/2017 | Goldstein et al. | |
| 2005/0141164 A1* | 6/2005 | Bender | H01H 85/0047 361/104 |
| 2008/0191832 A1 | 8/2008 | Tsai | |
| 2009/0009281 A1* | 1/2009 | Wang | H01H 85/0418 337/297 |
| 2009/0167480 A1* | 7/2009 | Wiryana | H01H 85/0411 337/297 |
| 2011/0090665 A1* | 4/2011 | Korony | H01C 1/148 361/821 |
| 2012/0092123 A1* | 4/2012 | Goldstein | H01H 85/0411 337/187 |
| 2017/0084415 A1* | 3/2017 | Nakanishi | H01H 85/041 |

OTHER PUBLICATIONS

DuPont, "DuPont 8453 Polymeric Silver Termination", Technical Data Sheet, Jan. 2012, 3 pages.
International Search Report and Written Opinion for PCT/US2020/028752, dated Aug. 5, 2020, 10 pages.

* cited by examiner

SURFACE-MOUNT THIN-FILM FUSE HAVING COMPLIANT TERMINALS

CROSS REFERENCE TO RELATED APPLICATION

The present application claims filing benefit of U.S. Provisional Patent Application Ser. No. 62/841,917 having a filing date of May 2, 2019, which is incorporated herein by reference in its entirety.

FIELD OF THE INVENTION

The present subject matter relates generally to surface-mount, thin-film components, and particularly to a surface-mount thin-film fuse having compliant terminals.

BACKGROUND OF THE INVENTION

Surface mounting has become a preferred technique for circuit board assembly. As a consequence, virtually all types of electronic components have been or are being redesigned for surface mount (i.e., leadless) embodiments or applications. The rapid incorporation of surface mount devices (SMD) into all types of electronic circuits has created a corresponding need for SMD fuses.

Fuses serve an essential function on many circuit boards. By fusing a circuit, selected sub-circuits and/or even certain individual components, it is possible to prevent damage to an entire system which may otherwise result from failure of a single, local component.

Surface mount fuses often experience intermittent current surges, which can generate significant heat. As a result the fuse can experience thermal cycling and thermal stresses. Thermal stresses can undesirably cause rigid terminations to detach from the surface to which the surface mount fuse is mounted.

SUMMARY

In accordance with one embodiment of the present disclosure, a surface-mountable thin-film fuse component may include a substrate having a top surface, a first end, and a second end that is spaced apart from the first end in a longitudinal direction. The thin-film fuse component may include a fuse layer formed over the top surface of the substrate. The fuse layer may include a thin-film fuse track. An external terminal may be disposed along the first end of the substrate and electrically connected with the thin-film fuse track. The external terminal may include a compliant layer comprising a conductive polymeric composition.

In accordance with one embodiment of the present disclosure, a method for forming a surface-mountable thin-film fuse component is disclosed. The method may include providing a substrate having a first end and a second end that is spaced apart from the first end in a longitudinal direction. The method may include depositing a fuse layer formed over the top surface of the substrate. The fuse layer may include a thin-film fuse track. The method may include forming an external terminal along the first end of the substrate and connected with the fuse layer. The external terminal may include a compliant layer including a conductive polymeric composition.

BRIEF DESCRIPTION OF THE DRAWINGS

A full and enabling description of the presently disclosed subject matter, including the best mode thereof, directed to one of ordinary skill in the art, is set forth in the specification, which makes reference to the appended figures, in which.

Figure 1:
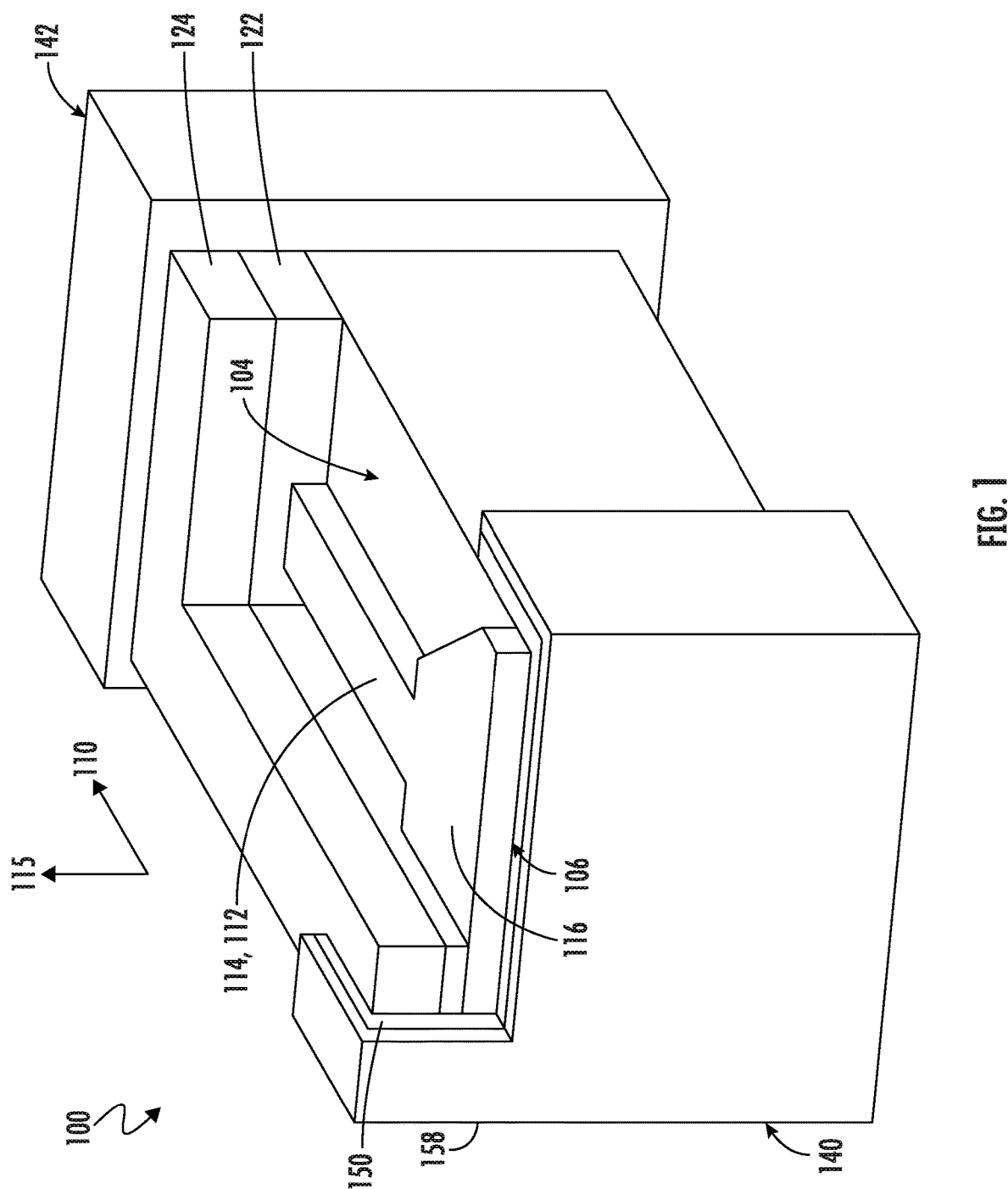
FIG. 1 illustrates a cutaway perspective view of an embodiment of a surface-mountable thin-film fuse component according to aspects of the present disclosure.

Repeat use of reference characters throughout the present specification and appended drawings is intended to represent same or analogous features, steps, or other elements of the present technology.

DETAILED DESCRIPTION OF REPRESENTATIVE EMBODIMENTS

It is to be understood by one skilled in the art that the present disclosure is a description of exemplary embodiments only, and is not intended as limiting the broader aspects of the present subject matter, which broader aspects are embodied in the exemplary constructions.

Generally, the present disclosure is directed to a surface-mountable (SMD) fuse including at least one external terminal including a compliant layer. Thin-film fuses often experience thermal cycling caused by current surges. During such thermal cycling, the compliant layers can prevent fracturing or detachment of the terminations from a mounting surface to which the external terminal is attached.

The thin-film fuse component may include a substrate having a first end and a second end that is spaced apart from the first end in a longitudinal direction. A fuse layer that includes a thin-film fuse track may be formed over the top surface of the substrate. A first external terminal may be disposed along the first end of the substrate and connected with the thin-film fuse track. A second external terminal may be disposed along the second end of the substrate and connected with the thin-film fuse track.

As used herein, "formed over," may refer to a layer that is directly in contact with another layer. However, intermediate layers may also be formed therebetween. Additionally, when used in reference to a bottom surface, "formed over" may be used relative to an exterior surface of the component. Thus, a layer that is "formed over" a bottom surface may be closer to the exterior of the component than the layer over which it is formed.

One or more of the external terminals may include a compliant layer including a conductive polymeric composition. The conductive polymeric composition may include one or more suitable polymeric materials. As one example, the compliant layer may include an epoxy, a polyimide, amidoamine, phenolic, and/or siloxane epoxy. The polymer may include a thermoset or thermoplastic resin.

The conductive polymeric composition may include conductive particles, which may be dispersed within the polymer (e.g., as a polymer matrix) and may improve the electrical conductivity of the compliant layer. The conductive particle may be or include a metal, such as silver, gold, copper, etc. For example, conductive particles may be or include silver, copper, gold, nickel, tin, titanium, or other conductive metals. Thus, in some embodiments the compliant layer may include a silver-filled polymer, nickel-filled polymer, copper-filled polymer etc.

In some embodiments, the one or more of the conductive particles may include a layer of conductive material formed over a base material. For instance, one or more of the conductive particles may have a layer of precious metal (e.g., silver, gold, etc.) over a base metal (e.g., copper).

The compliant layer may have a Young's modulus that is less than about 20 GPa as tested in accordance with ASTM D638-14 at about 23° C. and 20% relative humidity, in some embodiments less than about 10 GPa, in some embodiments less than about 5 GPa, and in some embodiments less than about 3 GPa.

The compliant layer may exhibit low electrical resistance. For example, the compliant layer may exhibit a volume resistivity that is less than about 0.01 ohm-cm tested in accordance with ASTM B193-16, in some embodiments less than about 0.001 ohm-cm, and in some embodiments about 0.0001 ohm-cm or less.

The compliant layer of the external terminations may be formed by dipping the monolithic body into a conductive polymeric composition solution to form a thick-film layer of the conductive polymeric composition.

The fuse layer, which may include the thin-film element, may be formed using a variety of suitable techniques. Examples of techniques that may be employed include chemical deposition (e.g., chemical vapor deposition), physical deposition (e.g., sputtering), or any other suitable deposition technique for forming thin-film elements. Additional examples include any suitable patterning technique (e.g., photolithography), etching, and any other suitable subtractive technique for forming thin-film elements.

The fuse layer, which may include a thin-film element, may be or include a variety of suitable materials. For example, a variety of metals may be used, including copper, which has high conductivity and ductility. In some embodiments, the thin-film element may be or include nickel (Ni).

The thickness of the fuse layer may vary. For example, in some embodiments thickness of the fuse layer may range from about 0.05 microns to about 40 microns, in some embodiments from about 0.1 microns to about 30 microns, in some embodiments from about 0.5 microns to about 10 micron.

In some embodiments, the fuse track may be generally straight. It should also be appreciated that other configurations are possible, for example, where additional length is required or desirable. As examples, in some embodiments, the fuse track may be curved, may zig-zag, or may have a sinusoidal shape.

The fuse track may be configured to "fail" or "blow" (e.g., stop electrically connecting the terminals together) when a current flows through the fuse track that is over a maximum current within a specified time. The maximum current may be related to the rated current of the fuse component. For example, the threshold current may be 250% of the rated current for the fuse to blow within 5 seconds.

In other embodiments, the fuse may have a maximum current that ranges from about 0.1 amperes to about 4 amperes, or more, and in some embodiments from about 0.25 amperes to about 2 amperes. In other embodiments, however, the fuse may be configured as an ultra-low current fuse. In such embodiments, the maximum current of the fuse may range from about 5 milliamperes (mA) to about 100 mA, in some embodiments from about 10 mA to about 75 mA, and in some embodiments from about 20 mA to about 50 mA.

The thin-film fuse component may include at least one terminal. In some embodiments, the component may include a pair of terminals. In other embodiments, however, the component may include greater than two terminals. For example, in some embodiments the number of terminals may range from 2 to 12, or more, in some embodiments from 2 to 10, and in some embodiments from 2 to 8. The terminals may be arranged symmetrically about a longitudinal centerline, a lateral centerline, or both. For example, the component may include 2 terminals on each side, 3 terminals on each side, 4 terminals on each side, or more.

The terminal(s) may include multiple layers. The layers may be formed using a variety of techniques, such as dipping, screen printing, electroplating, chemical deposition (e.g., chemical vapor deposition), physical deposition (e.g., sputtering), or any other suitable technique.

In some embodiments, the terminals may include a first layer formed over the first end of the substrate and in electrical contact with the thin-film fuse track. The first layer of conductive material may be or include copper (e.g., formed using dipping or printing of a conductive paste). In other embodiments, the first layer of conductive material may be or include a variety of other suitable materials, such as gold, silver, platinum, nickel, copper, steel, or combination thereof. The compliant layer may be formed over the first layer. However, it should be understood that multiple layers may be formed between the compliant layer and the substrate.

In some embodiments, the terminal may include one or more additional conductive layers formed over the compliant layer, which may be formed over the first layer. For example, a second layer may be formed over the compliant layer. Thus, the compliant layer may be formed between the first layer and second layer. In some embodiments, a third layer may be formed over the second layer. The second and/or third layers may comprise a solderable conductive material. For example, the second layer may be or include nickel. The third layer may be or include tin. It should be understood that the second and/or third layers alternatively may be or include tin, nickel, lead, or mixtures thereof.

A thickness of the first layer of the terminal may range from about 10 microns to about 200 microns, in some embodiments from about 15 microns to about 100 microns, in some embodiments from about 15 microns to about 80 microns, and in some embodiments from about 20 microns to about 60 microns.

A maximum thickness of the compliant layer of the terminal may range from about 10 microns to about 200 microns, in some embodiments from about 15 microns to about 100 microns, in some embodiments from about 15 microns to about 80 microns, and in some embodiments from about 20 microns to about 60 microns.

A ratio of the maximum thickness of the compliant layer to the thickness of the fuse layer may range from about 0.25 to about 100, in some embodiments from about 0.3 to about 50, in some embodiments from about 0.5 to about 30, in some embodiments from about 1 to about 20, in some embodiments from about 2 to about 10, and in some embodiments from about 3 to about 8. For example, fuses having relatively small contact areas (corresponding with thin fuse layers) may benefit from relatively thicker compliant layers to mitigate thermal stresses at the contact areas between the fuse layer and external terminals. Thus, the above ratios described may provide a more robust and reliable connection between the fuse layer and the external terminals, thereby making the fuse more robust and reliable.

A thickness of the second layer of the terminal may range from about 1 micron to about 30 microns, in some embodiments from about 2 microns to about 20 microns, in some embodiments from about 3 microns to about 15 microns, in some embodiments from about 4 microns to about 10 microns, e.g., about 7 microns.

An overall thickness of the terminal (e.g., including both the first layer and any subsequent layers, if present) may preferably range from about 15 microns to about 60 microns, and in some embodiments from about 20 microns to about 40 microns.

The fuse layer may include one or more contact pads connected with the thin-film fuse track. A first contact pad may be electrically connected with the thin-film element, the contact pad extending to one of the first end or the second end of the substrate and electrically connected with one of the external terminal at the first end.

In some embodiments, the component may include at least one adhesion layer formed over and/or beneath the fuse layer. The adhesion layer may be or include a variety of materials that are suitable for improving adhesion between the fuse layer and adjacent layers. For example, the adhesion layer may include at least one of Ta, Cr, TaN, TiW, Ti, or TiN. For example, in some embodiments, the adhesion layer may be or include tantalum (Ta) (e.g., tantalum or an oxide or nitride thereof) and may be formed between the fuse layer and substrate to improve adhesion. As another example, in some embodiments, the adhesion layer may be formed over the fuse layer and beneath a passivation layer, which is described in greater detail below. Without being bound by theory, the material of the adhesion layer may be selected to overcome phenomena such as lattice mismatch and residual stresses.

The adhesion layer(s) may have a variety of suitable thicknesses. For example, in some embodiments, the thickness of an adhesion layer may range from about 100 angstroms to about 2000 angstroms, in some embodiments from about 200 angstroms to about 800 angstroms, in some embodiments from about 400 angstroms to about 600 angstroms.

In alternative embodiments, the thin-film fuse component may include one or more passivation layers formed over at least a portion of the fuse layer. The passivation layer may be applied over the fuse layer. The passivation layer may cover and protect the thin-film fuse from the deposition process (e.g., electroplating) that is used to form the terminals. The passivation layer may be formed from a variety of suitable materials, including polymer materials. For example, in some embodiments, the passivation layer may be or include polyimide. In some embodiments, the passivation layer(s) may include at least one of silicon oxynitride, $Al_2O_3$, $SiO_2$, $Si_3N_4$, benzocyclobutene, or glass.

In some embodiments, a protective layer may be applied over the passivation layer (if present) or directly over the fuse layer. The protective layer may have a thickness ranging from about 3 microns to about 25 microns, in some embodiments from about 5 microns to about 20 microns, and in some embodiments from about 7 microns to about 15 microns. In some embodiments, multiple protective layers may be employed.

The substrate, passivation layer, and/or protective layer may be formed from a variety of inorganic materials such as glass, ceramic, or a glass-ceramic mixture. The substrate may generally have a low thermal conductivity, such as less than about 10 W/(m·K), in some embodiments less than about 5 W/(m·K), in some embodiments less than about 3 W/(m·K), in some embodiments less than about 2 W/(m·K), and in some embodiments less than about 1 W/(m·K), and in some embodiments, greater than about 0.1 W/(m·K). In other embodiments, however, the substrate may have a thermal conductivity greater than 10 W/(m·K) and/For example, the substrate may include, silicon oxynitride, silicon oxide, silicon, alumina, sapphire, and/or another suitable material.

In some embodiments, the passivation layer, and/or protective layer may be formed by depositing a paste (e.g., a glass paste, glass-ceramic paste, etc.) followed by a firing step. Any suitable process, however, may be used to form the passivation layer and/or protective layer.

Figure 2:
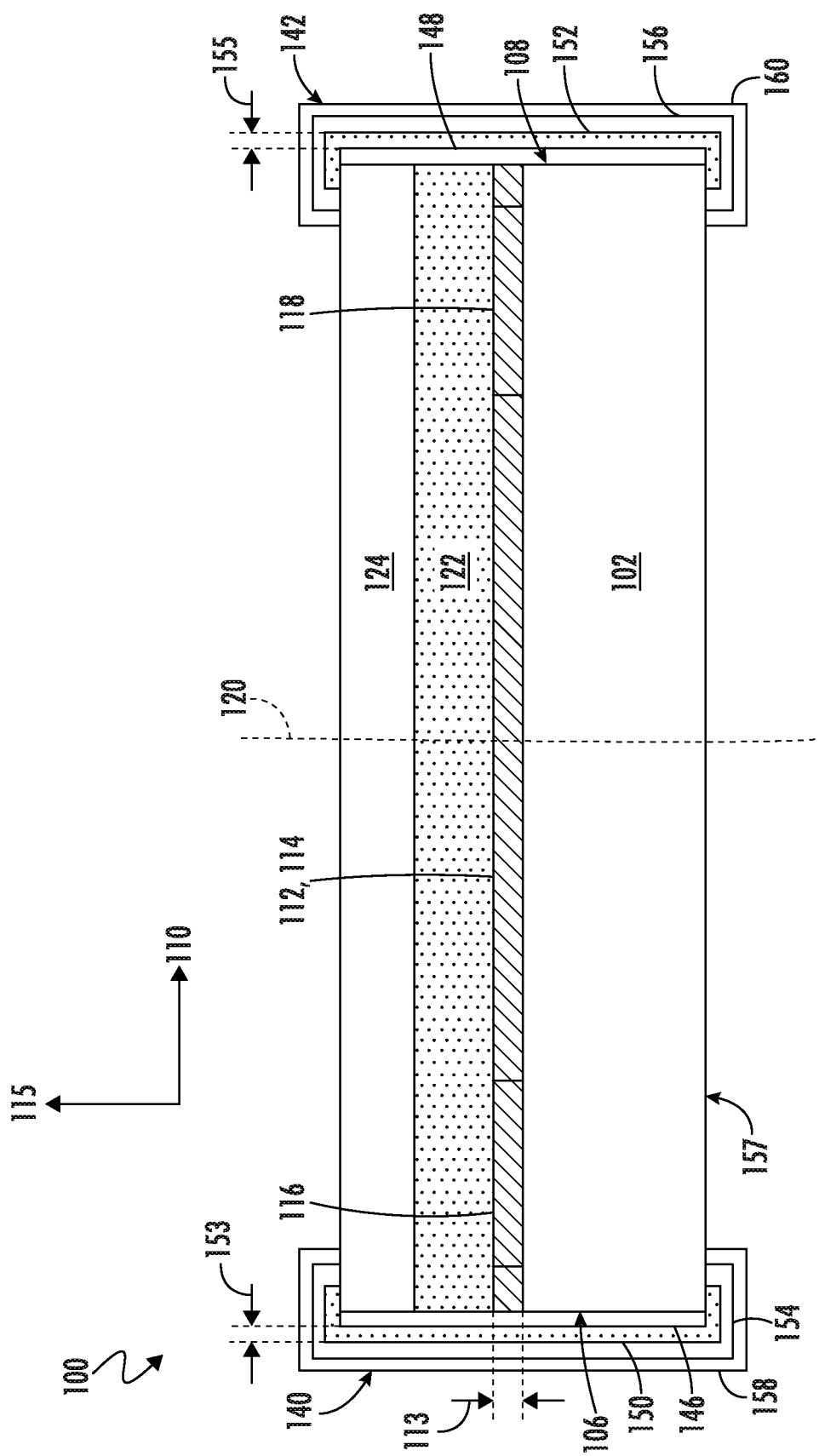
FIG. 2 illustrates a side elevation view of the embodiment of the surface-mountable fuse component of FIG. 1, according to aspects of the present disclosure.

FIG. 1 is a perspective view of one embodiment of a surface-mountable thin-film fuse component 100 according to aspects of the present disclosure. FIG. 2 is a side elevation view of the surface-mountable thin-film fuse component 100 of FIG. 1 illustrating external terminals that include compliant layers. Referring to FIGS. 1 and 2, the surface-mountable thin-film fuse component 100 may include a substrate 102. The substrate 102 may have a top surface 104, a first end 106, and a second end 108 (FIG. 1) that is spaced apart from the first end 106 in a longitudinal direction 110.

A fuse layer 112 may be formed over the top surface 104 of the substrate 102. The fuse layer 112 may include a thin-film fuse track 114. The fuse layer 112 may have a thickness 113 in a Z-direction 115 that is less than about 40 microns. The fuse track 114 may be generally straight, for example as shown in FIG. 1. It should also be appreciated that other configurations are possible, for example, where additional length is required or desirable. As examples, in some embodiments, the fuse track 114 may be curved, may zig-zag, or may have a sinusoidal shape.

The fuse track 114 may be configured to "fail" or "blow" (e.g., stop electrically connecting the terminals together) when a current flows through the fuse track 114 that is over a maximum current within a specified time (e.g., 5 seconds). The maximum current may be related to the rated current of the fuse component. For example, the threshold current may be 250% of the rated current for the fuse to blow within 5 seconds.

The fuse layer 112 may include a first contact pad 116 extending to the first end 106 of the substrate 102 and a second contact pad 118 (FIG. 2) extending to second end 108 of the substrate 102. The contact pads 116, 118 may be integrally formed with the fuse track 114 during formation of the fuse layer 112. The second contact pad 118 may be generally similar to the first contact pad 116. For example, the contact pads 116, 118 may be symmetric with respect to a lateral centerline 120 (FIG. 2). However, it should be understood that the contact pads 116, 118 may have any suitable shape, including rectangular square, triangular, circular, etc.

The surface-mountable thin-film fuse component 100 may include one or more passivation layers formed over the thin-film fuse layer 112. For example, a first passivation layer 122 may be formed over the thin-film fuse layer 112. A second passivation layer 124 may be formed over the first passivation layer 122.

The surface-mountable thin-film fuse component 100 may include a first external terminal 140 disposed along the first end 106 of the substrate 102 and connected with the first contact pad 116 of the fuse layer 112. The surface-mountable thin-film fuse component 100 may include a second external terminal 142 disposed along the second end 108 of the substrate 102 and connected with the second contact pad 118.

For example, the first external terminal 140 may include a first base layer 146 formed over the first end 106 of the substrate 102 and electrically connected with the first contact pad 116. The second external terminal 142 may include a second base layer 148 formed over the second end 108 of the substrate 102 and electrically connected with the second contact pad 118. The base layers 146, 148 may be formed by dipping the ends 106, 108 of the substrate 102 to form thick-film layers of a conductive material, such as copper, silver, gold, etc. In other embodiments, however, the base layers 146,148 may be formed using other suitable techniques such as plating (e.g., electrolytic or electroless plating or combination thereof).

The first external terminal 140 may include a first compliant layer 150 formed over the first base layer 146. The second external terminal 142 may include a second compliant layer 152 formed over the second base layer 148. The compliant layers 150, 152 may include a conductive polymeric composition. For example, the conductive polymeric composition may include a polymeric material (e.g., an epoxy) and conductive particles, for example as described above.

The compliant layers 150, 152 may have respective maximum thicknesses 153, 155 in the longitudinal direction 110. A ratio of the maximum thicknesses 153, 155 of the compliant layers 150, 152 to the thickness 113 of the fuse layer 112 may range from about 0.25 to about 4.

The external terminals 140, 142 may include one or more plated layers formed over the compliant layers 150, 152. For example, the first external terminal 140 may include a first plated layer 154 formed over the first compliant layer 150. The second external terminal 142 may include a first plated layer 156 formed over the second compliant layer 152. In some embodiments, respective second plated layers 158, 160 may optionally be formed over the first plated layers 154, 156.

The plated layers 154, 156, 158, 160 may be formed of a variety of suitable metals. In one embodiment, the first plated layers 154, 156 may include nickel. The second plated layers 158, 160 may include tin. However, any suitable combination of conductive materials may be used for the first plated layers 154, 156, and/or second plated layers 158, 160. In other embodiments, however, the terminals 140, 142 may have a different plating configuration (e.g., be free of one or more of the first plated layers 154, 156 and/or the second plated layers 158, 160).

In some embodiments, a protective layer may be exposed along an exterior of the surface-mountable thin-film fuse component 100 (e.g., applied over the passivation layer(s) 122, 124 and/or a bottom surface 157 of the substrate 102). The protective layers may have thicknesses ranging from about 5 microns to about 25 microns. As examples, the protective layer(s) may include glass, ceramic, or a glass-ceramic mixture.

As one example, the passivation layer(s) 122, 124 may be or include glass or a glass-ceramic mixture. The protective layer(s) may be formed over the second passivation layer 124 and may be or include glass or a glass-ceramic mixture.

Figure 3A:
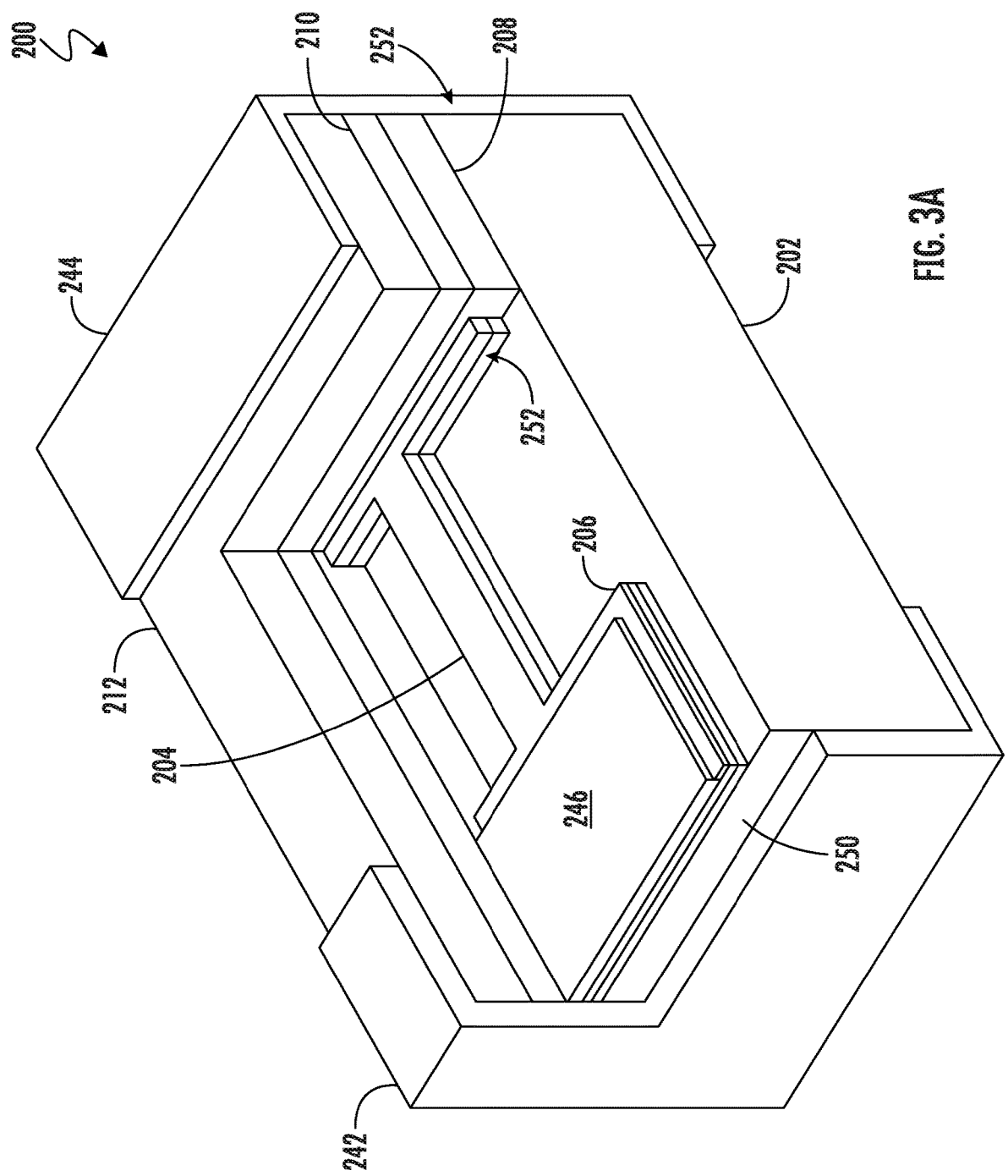
FIG. 3A illustrates a perspective view of another embodiment of a surface-mountable thin-film fuse component according to aspects of the present disclosure.
Figure 3B:
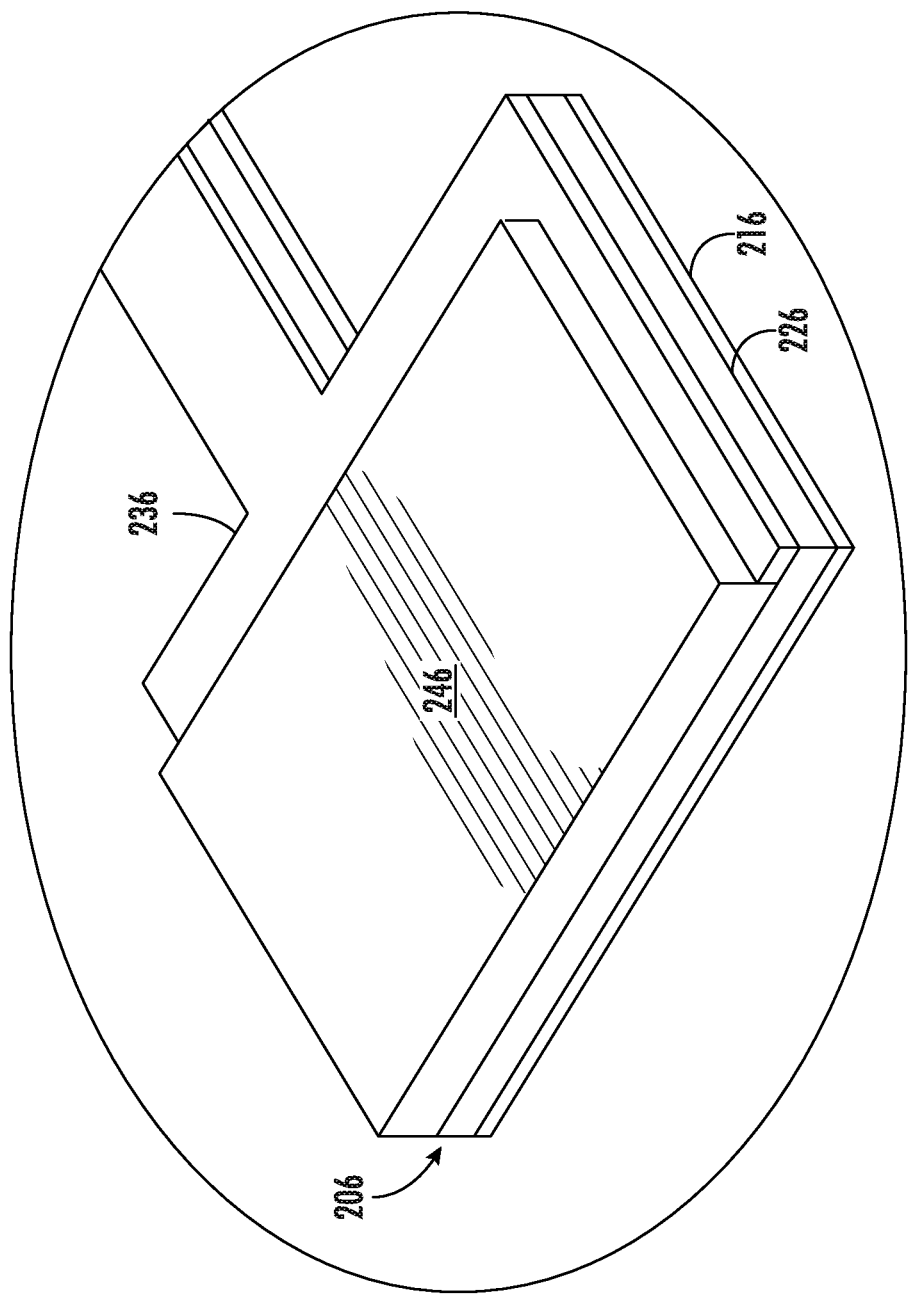
FIG. 3B illustrates a perspective view of a portion of the embodiment of the surface-mountable thin-film fuse component of FIG. 3A.

FIG. 3A illustrates a perspective view of another embodiment of a surface-mountable thin-film fuse component 200 according to aspects of the present disclosure. FIG. 3B illustrates a perspective view of a portion of the surface-mountable thin-film fuse component 200 of FIG. 3A. The surface-mountable thin-film fuse component 200 may be built include a number of layers in substantially the same manner as previously described with reference to FIG. 1, starting with a glass, ceramic, or glass-ceramic substrate layer 202. A fuse layer 204 may include a fuse track with integral contact pads 206 at each end thereof, for example as described above with reference to FIG. 1. The fuse layer 204 may be formed by sputtering conductive material onto the substrate 202, and then by patterning the fuse track and contact pads 206. The fuse layer 204 may include copper or nickel. One or more adhesion layers may be formed under the fuse layer 204 and/or over the fuse layer 204 to improve adhesion between the fuse layer and adjacent layers (e.g., the substrate 202 and/or a first passivation layer 208).

The surface-mountable thin-film fuse component 200 may include a first external terminal 242 disposed along a first end 250 of the substrate 202 and connected with the first contact pad 206 of the fuse layer 204. The surface-mountable thin-film fuse component 200 may include a second external terminal 244 disposed along the second end 252 of the substrate 202 and connected with a second contact pad 254.

More specifically, referring to FIG. 3B, the surface-mountable thin-film fuse component 200 may include a first adhesion layer 216 covering a conductive layer 226 (e.g., nickel) of the contact pad 206. The surface-mountable thin-film fuse component 200 may include a second adhesion layer 236 formed over the conductive layer 226 of the contact pad 206. In this example, the conductive layer 226 and adhesion layers 216, 236 (if present), may have a total thickness ranging from about 0.1 microns to about 10 microns thick. The adhesion layers 216, 236 and conductive layer 226 may be successively sputtered over the substrate 202 (FIG. 3A). In alternative embodiments, magnetic metals such as Ni, Co, Fe or their alloys, or other metals such as copper having appropriate resistance/melting points may be employed. As discussed above, other materials and configurations may also be employed.

In some embodiments, an electrode material 246 may be provided over and be in contact with the conductive layer 226 (e.g., including nickel or copper). The electrode material 246 may extend to an edge of the substrate 202 (FIG. 3A) such that the electrode material 246 contacts the first external terminal 242 (FIG. 3A). Thus, the electrode material 246 may increase a contact area between the fuse layer 206 and the first external terminal 242 to form a more robust connection therebetween. As a result, the fuse may be more resilient against thermal cycling and thermal stresses.

In an exemplary configuration, the electrode material 446 may be copper (Cu) and may be electroplated over the first passivation layer 216. Other methods for depositing the electrode material 246 may also be employed as would be recognized by those of ordinary skill in the art. It should also be appreciated that the electrode material 246 may be fabricated from conductive materials other than copper. In addition, it should be understood that in some embodiments, the surface-mountable thin-film fuse component 200 may lack this additional electrode material 246.

Referring again to FIG. 3A, following placement of the electrode material 246, a first passivation layer 208 of silicon oxynitride (SiNO) may be formed over the fuse layer 204. A second passivation layer 210 (or protective sealing layer) may be formed over the passivation layer 208. Finally a glass cover 212, or alternatively, other insulating material, may be applied. The end terminations 242, 244 may include compliant layers and may generally be configured as described above with reference to FIG. 2.

Figure 4:
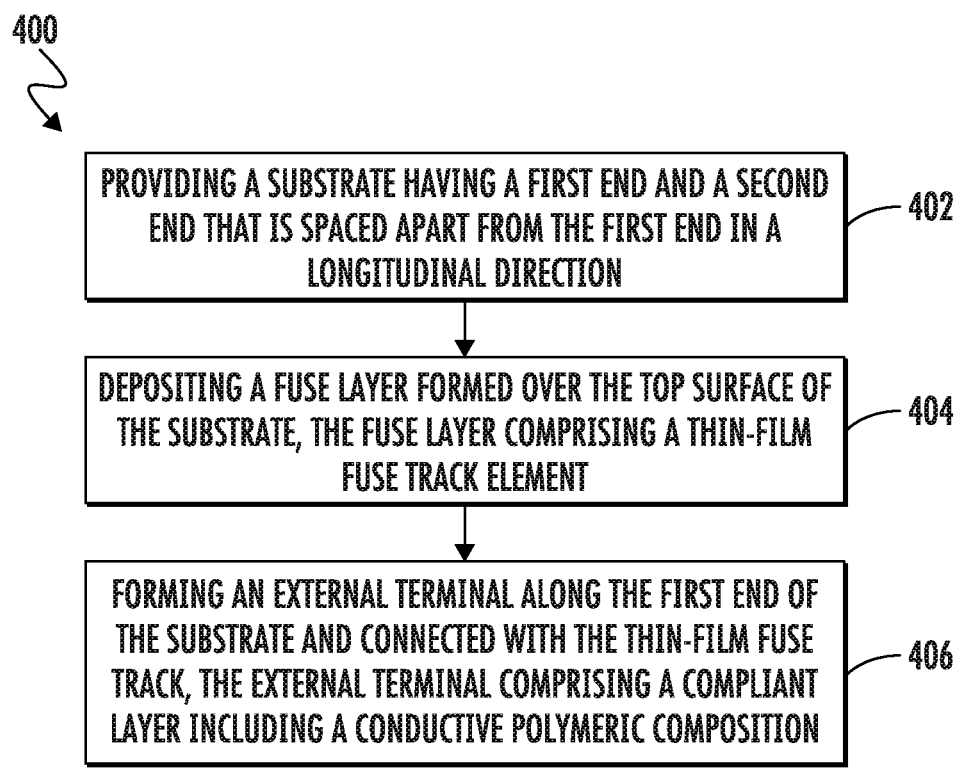
FIG. 4 is a flowchart of a method for forming a surface-mountable thin-film fuse component according to aspects of the present disclosure.

FIG. 4 is a flowchart of a method 400 for forming a surface-mountable thin-film fuse component according to aspects of the present disclosure. In general, the method 400 will be described herein with reference to the surface-mountable thin-film fuse components 100, 200 described above with reference to FIGS. 1 through 3B. However, it should be appreciated that the disclosed method 400 may be implemented with any suitable thin film fuse. In addition, although FIG. 4 depicts steps performed in a particular order for purposes of illustration and discussion, the methods discussed herein are not limited to any particular order or arrangement. One skilled in the art, using the disclosures provided herein, will appreciate that various steps of the methods disclosed herein can be omitted, rearranged, combined, and/or adapted in various ways without deviating from the scope of the present disclosure.

The method 400 may include, at (402), providing a substrate having a first end and a second end that is spaced apart from the first end in a longitudinal direction, for example as described above with reference to FIGS. 1 through 3B.

The method 400 may include, at (404), depositing a fuse layer formed over the top surface of the substrate. The fuse layer may include a thin-film fuse track, for example as described above with reference to FIGS. 1 through 3B.

The method 400 may include, at (406), forming an external terminal along the first end of the substrate and connected with the fuse layer, for example as described above with reference to FIGS. 1 through 3B. The external terminal may include a compliant layer, which may include a conductive polymeric composition.

While the present subject matter has been described in detail with respect to specific embodiments thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:

1. A surface-mountable thin-film fuse component comprising:
   a substrate having a top surface, a first end, and a second end that is spaced apart from the first end in a longitudinal direction;
   a fuse layer formed over the top surface of the substrate, the fuse layer comprising a thin-film fuse track; and
   an external terminal disposed along the first end of the substrate and connected with the fuse layer, the external terminal comprising a compliant layer comprising a conductive polymeric composition, wherein:
   the fuse layer has a fuse layer thickness in a Z-direction that is perpendicular to the top surface of the substrate;
   the compliant layer has a maximum compliant layer thickness in the longitudinal direction; and
   a ratio of the fuse layer thickness to the maximum compliant layer thickness ranges from about 0.25 to about 100.

2. The surface-mountable thin-film fuse component of claim 1, wherein the conductive polymeric composition comprises an epoxy.

3. The surface-mountable thin-film fuse component of claim 1, wherein the conductive polymeric composition comprises conductive particles.

4. The surface-mountable thin-film fuse component of claim 3, wherein the conductive particles comprise silver.

5. The surface-mountable thin-film fuse component of claim 1, wherein the thin-film fuse track has a thickness in the Z-direction that is less than about 40 microns.

6. The surface-mountable thin-film fuse component of claim 1, wherein the fuse layer further comprises a contact pad electrically connected with the thin-film fuse track, the contact pad extending to one of the first end or the second end of the substrate and electrically connected with one of the external terminal at the first end.

7. The surface-mountable thin-film fuse component of claim 6, wherein the external terminal comprises a first layer formed over the first end of the substrate and in electrical contact with the contact pad, and wherein the compliant layer is formed over the first layer.

8. The surface-mountable thin-film fuse component of claim 7, wherein the first layer comprises copper.

9. The surface-mountable thin-film fuse component of claim 1, wherein the external terminal comprises a plated layer over the compliant layer.

10. The surface-mountable thin-film fuse component of claim 9, wherein the plated layer comprises at least one of tin or nickel.

11. The surface-mountable thin-film fuse component of claim 1, wherein the surface-mountable thin film fuse component comprises a protective layer formed over the fuse layer.

12. The surface-mountable thin-film fuse component of claim 11, wherein the protective layer comprises glass.

13. The surface-mountable thin-film fuse component of claim 1, wherein the substrate comprises glass.

14. The surface-mountable thin-film fuse component of claim 1, wherein the surface-mountable thin-film fuse component is designed to blow if exposed to a maximum current that ranges from about 0.1 A to about 4 A.

15. A surface-mountable thin-film fuse component comprising:
   a substrate having a top surface, a first end, and a second end that is spaced apart from the first end in a longitudinal direction;
   a fuse layer formed over the top surface of the substrate, the fuse layer comprising a thin-film fuse track and a contact pad electrically connected with the thin-film fuse track; and
   an external terminal disposed along the first end of the substrate and connected with the fuse layer, the external terminal comprising a compliant layer comprising a conductive polymeric composition, wherein:
   the contact pad extends to one of the first end or the second end of the substrate and is electrically connected with the external terminal at the first end,
   the external terminal comprises a first layer formed over the first end of the substrate and in electrical contact with the contact pad, and
   the compliant layer is formed over the first layer.

* * * * *